United States Patent Office 3,019,641 Patented Feb. 6, 1962

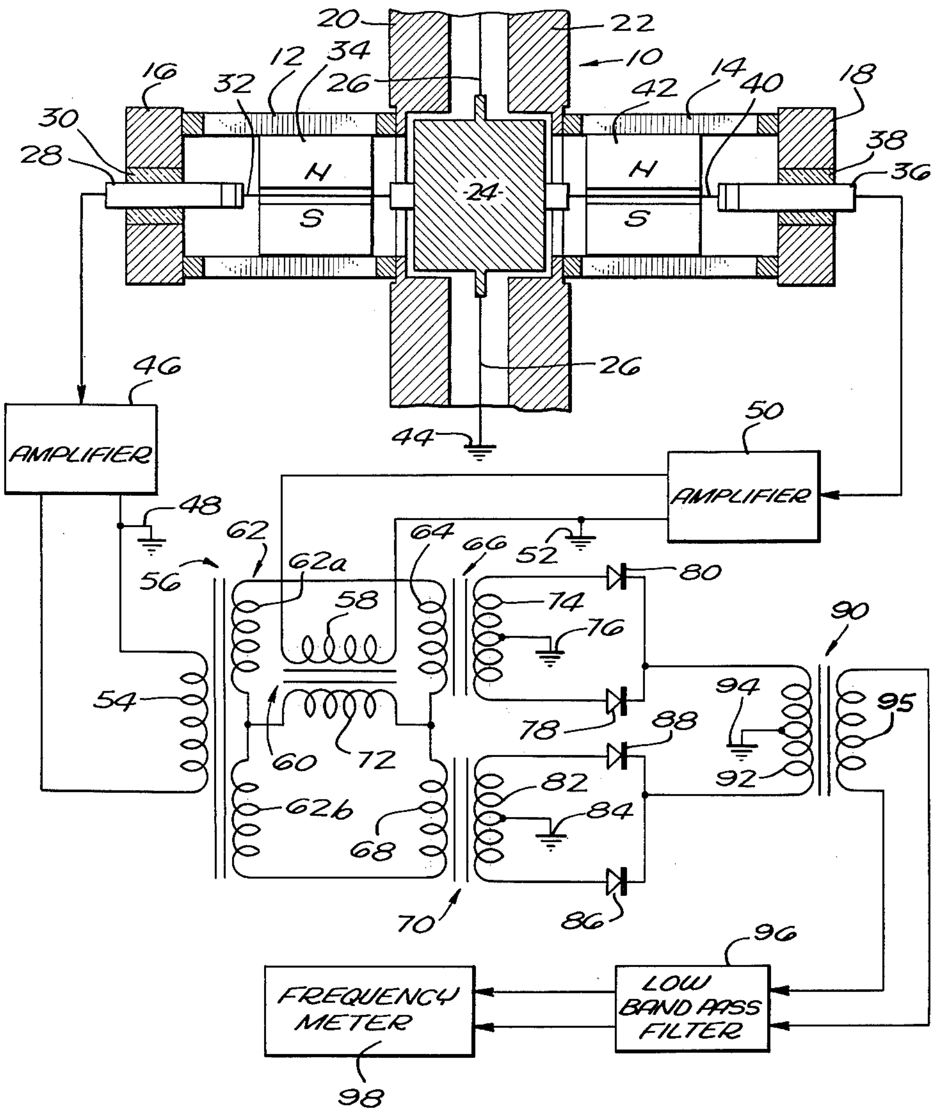
INVENTOR.
HASKELL SHAPIRO
BY [signature]
ATTORNEY

3,019,641
FORCE MEASURING SYSTEM

Haskell Shapiro, Glendale, Calif., assignor to Borg-Warner Corporation, Chicago, Ill., a corporation of Illinois Filed Apr. 9, 1959, Ser. No. 805,253
11 Claims. (Cl. 73—141)

This invention relates to frequency changing circuits, and more particularly to electronic circuits for effecting the sum and difference of two given frequencies.

In certain electronic apparatus, as for instance computers and the like, it is necessary to have electronic means whereby the frequencies of two electrical signals can be arithmetically added or subtracted. That is, in certain types of electronic equipment, it becomes necessary to so combine two independent frequencies, $f_1$ and $f_2$, such as to afford either or both of $f_1$ plus $f_2$ and $f_1$ minus $f_2$. In order to accomplish this, mixer circuits are employed which provide an output signal having a frequency which is made up of not only the sum and difference of the original frequencies, but also the many multiples of each of the original frequencies and all of the various combinations of such original frequencies, multiples, sum and difference frequencies. It then becomes a matter of selecting the proper conventional band-pass filtering means for isolating the particular sum or difference frequency desired. However, devices heretofore used have been unsatisfactory in providing such sum and difference frequencies where the original frequencies are so related that a multiple of one or the other of the original frequencies is so close in value to the sum or difference frequency desired that conventional band-pass filtering means is incapable of distinguishing therebetween. For instance, where the original frequencies ($f_1$ and $f_2$) are substantially identical, the output signals of such heretofore conventional mixer circuits provide $2f_1$, $2f_2$ and $f_1$ plus $f_2$ which cannot be separated by conventional filtering means since all of such frequencies react in the same manner to a given band-pass filter. This dilemma is particularly pointed up on page 337 of the Handbook of Piezoelectric Crystals for Radio Equipment Designers (WADC Technical Report 56—156) where it is stated that certain relationships of the original frequenices define "forbidden values" of frequencies as regards their being added and subtracted and eventually separated by conventional filter circuits.

In view of the foregoing, it is an object of this invention to provide electronic mixing means whereby conventional filtering means may be used to isolate either the sum or difference frequencies of two original frequencies which are extremely close in value.

Another object is to provide an electronic mixer whereby two substantially identical sinusoidally varying signals may be combined in such a manner as to permit conventional filtering means to isolate either the sum or the difference of the frequencies of such signals.

Another object of this invention is to provide an electronic mixer as characterized above, wherein means is afforded for providing both the sum and the difference of said signal potentials in addition to means for squaring each of said potential sum and potential difference and means for providing the difference between said squared potential sum and said squared potential difference.

Another object of this invention is to provide a frequency mixer as characterized above, employing potential squaring means having a pair of full-wave rectifiers which are balanced with respect to each other.

Another object of this invention is to provide a frequency mixer as characterized above, wherein each of the full-wave rectifiers comprises a pair of unidirectional square-law devices which are balanced with respect to each other.

Another object of this invention is to provide a force measuring system comprising a pair of vibratory strings fixed to a force responsive element and wherein is included a frequency mixer having potential squaring means comprising a pair of full-wave rectifiers which are balanced with respect to each other.

Another object of this invention is to provide a force measuring system as characterized above, wherein each of the full-wave rectifiers of the frequency mixer comprises a pair of unidirectional square-law devices which are balanced with respect to each other.

Another object of this invention is to provide a force measuring system as characterized above, including means for vibrating said strings comprising individual feedback amplifiers associated with individual resistance bridge networks having a separate one of said strings as a tuned electrical element, and having means affording constant magnetic flux flow transverse with respect to said strings.

The novel features which I consider characteristic of my invention are set forth with particularity in the appended claims. The device itself, however, both as to its organization and mode of operation, together with additional objects and advantages thereof, will best be understood from the following description of specific embodiments when read in connection with the accompanying drawing in which:

The single FIGURE is a schematic diagram of the novel frequency mixer connected in circuit with associated equipment including a force responsive mechanism shown in section.

Referring to such single figure of the drawing, it shows a force responsive device or transducer 10 having a pair of generally cylindrically shaped housings 12 and 14 each of which is provided with an end wall 16 and 18 respectively. Housings 12 and 14 are fixed respectively to disc-like support members 20 and 22 which are fastened together along their outer peripheral edges (not shown). A force responsive member or mass 24 is positioned between housings 12 and 14 centrally of disc-like support members 20 and 22, there being a plurality of support wires 26 fastened to and extending radially from mass 24 and fastened near the outer periphery of discs 20 and 22 to support mass 24 as shown while offering substantially no resistance to axial movement thereof as will hereinafter appear in greater detail.

End wall 16 of housing 12 is provided with a central opening wherein is positioned a terminal-mounting pin 28 and suitable hermetic sealing and electrical insulating means 30. An electrically conductive nonmagnetic prestressed vibratory string or wire 32 has one of its ends fixed to pin 28, while its other end is fixed to a tab formed on mass 24 for that purpose. Mounted within housing 12 is a substantially C-shaped permanent magnet 34 having opposed pole faces disposed on opposite sides of vibratory string 32.

In like manner, end wall 18 of housing 14 is provided with an opening wherein is positioned a terminal-mounting pin 36 and suitable hermetic sealing and electrical insulating means 38. A nonmagnetic electrically conductive prestressed vibratory string or wire 40 is fastened between pin 36 and a tab formed on mass 24, and a substantially C-shaped permanent magnet 42 is positioned within housing 14 such that the opposed pole faces thereof are disposed on opposite sides of string 40. Support wires 26 for mass 24 are grounded as at 44 to complete electrical circuits to be hereinafter described.

In circuit with terminal-mounting pin 28 of force responsive device 10, is an amplifier 46 which is grounded as at 48. In like manner, terminal-mounting pin 36 is connected in circuit with an amplifier 50 which is grounded as at 52. Each of the amplifiers 46 and 50 comprises a resistance bridge network having the respective one of the strings 32 and 40 as a leg thereof. Also, each of such amplifiers includes a feedback circuit to sustain the respective vibratory string in vibration at its natural resonant frequency, as will hereinafter be explained.

The output terminals of amplifier 46 are connected to a primary winding 54 of a transformer 56 which constitutes part of the frequency mixer circuit. The output of amplifier 50 is connected in circuit with a primary winding 58 of a transformer 60. Transformer 56 has a center-tapped secondary winding 62 comprising coils **62*a* and 62*b* and is connected in series circuit relation with a primary winding 64 of a transformer 66 and a primary winding 68 of a transformer 70**.

Transformer 60, the primary winding 58 of which is connected in circuit with amplifier 50, is provided with a secondary winding 72 which is connected between the center-tap of the secondary winding 62 of transformer 56 and the juncture of primary windings 64 and 68 of transformers 66 and 70 respectively.

Transformer 66 further comprises a secondary winding 74 having a center-tap which is grounded as at 76. Winding 74 is connected in series circuit relation with a pair of oppositely disposed unidirectional square-law devices or rectifiers 78 and 80. In like manner, transformer 70 is provided with a secondary winding 82 which has a center-tap grounded as at 84 and which is connected in series circuit arrangement with a pair of oppositely disposed square-law devices or rectifiers 86 and 88. An output transformer 90 is provided with a primary winding 92 which is grounded as at 94 and connected between the junctures of the respective pairs of rectifiers 78 and 80, and 86 and 88. Transformer 90 also comprises a secondary winding 95 which is connected to a band-pass filter shown in the drawing as block 96, said filter being connected in circuit with a frequency meter denoted by block 98.

In the present invention, square-law device 78 should be balanced with respect to square-law device 80, and device 86 should be balanced with respect to device 88 so as to provide a pair of full-wave rectifiers each of which is substantially symmetrical in operation. Also, each of such full-wave rectifiers should be balanced with respect to each other to insure substantially identical operation. It has been found desirable in the present invention to employ a plurality of square-law devices or rectifiers in each of the several legs of the full-wave rectifier circuits not only to facilitate matching or balancing of the rectifying characteristics of the several legs of the rectifiers, but also to permit the use of higher potentials in such rectifier circuits. It is contemplated within the scope of the present invention that square-law devices 78, 80, 86 and 88 may be either conventional thermionic diodes or suitable crystals, as for instance, silicon or germanium.

The operation of the force measuring system generally and the frequency mixing network in particular is as follows:

As above explained, amplifier 46 comprises a resistance bridge network which includes electrically conductive vibratory string 32 as a tuned electrical element. Referring to the drawing, the electrical circuit for string 32 comprises the electrical conductor which interconnects amplifier 46 and terminal-mounting pin 28, and also said pin 28, mass 24, and support wires 26. String 32 is caused to mechanically vibrate at its resonant frequency in accordance with the stress thereof. Such movement of string 32 in a plane transverse with respect to the constant magnetic field afforded by permanent magnet 34 creates a current flow in said string 32 the frequency of which varies in accordance with the rate of mechanical vibration thereof.

As also previously explained, amplifier 46 includes a feedback circuit to the resistance bridge network which comprises string 32. Such bridge network is so constructed that vibration of string 32 at its resonant frequency causes the bridge network to provide an output which enables sufficient current to be fed back to the string 32 to sustain it in vibration at its resonant frequency as dictated by its stress. This obtains by virtue of such feedback current flowing through string 32 and causing a magnetic field to be generated thereabout, which magnetic field reacts with the permanent magnetic field afforded by magnet 34 to create a force on string 32. In view of this, a potential is developed across primary winding 54 of transformer 56 which varies at the same rate as the string vibrates.

In like manner, string 40 is a part of the resistance bridge network of amplifier 50 by virtue of the electrical circuit comprising the conductor to amplifier 50, terminal-mounting pin 36, string 40, mass 24 and supporting wires 26. Also, amplifier 50 comprises a feedback circuit, as above explained with reference to amplifier 46, for sustaining string 40 in vibration at the resonant frequencies corresponding to the stress thereof. Such operation, of course, develops a potential across primary winding 58 of transformer 60, which potential varies at the same rate as string 40 vibrates.

As mass 24 is moved to either the left or the right as viewed in the single figure of the drawing, the respective stresses or tensions of strings 32 and 40 are varied accordingly, thereby effecting a change in the frequencies of the potentials developed in the aforementioned primary windings 54 and 58 of transformers 56 and 60, respectively. Said mass 24 may be made responsive to any force which it is desired to measure, as for instance, accelerations or pressures.

The alternating potential developed in primary winding 54 creates a corresponding alternating potential in each of secondary windings **62*a* and 62*b* of transformer 56. Thereby, current is caused to flow through primary windings 64 and 68 of transformers 66 and 70** respectively for the development of varying potentials thereacross.

The varying potential developed across primary winding 58 of transformer 60 develops a corresponding potential across secondary winding 72 thereof, whereupon corresponding current is caused to flow through primary windings 64 and 68 of transformers 66 and 70, respectively. In this manner, two potentials are developed across each of such windings 64 and 68, but due to the above described circuit connections, the two potentials in one of such windings aid each other and hence are additive, whereas in the other of such windings the potentials are opposed and hence the difference therebetween is obtained.

Such sum and difference voltage resultants in primary windings 64 and 68 cause corresponding sum and difference potentials to be generated in secondary windings 74 and 82 respectively. The latter potentials are then rectified in the respective full-wave rectifier circuits, and due to the square-law characteristics of the various rectifying devices 80, 78, 88 and 86, such sum and difference potentials are effectively algebraically squared.

In view of the fact that each of the full-wave rectifier circuits is individually connected to a separate end of the center-tapped primary winding 92 of transformer 90, the secondary winding 95 is provided with a signal which is the difference between such squared voltage potential sum and such squared voltage potential difference.

In the process of treating the original potentials as above described, the frequencies thereof are so combined that the signal appearing across secondary winding 95 of transformer 90 comprises both the sum and the difference of such original frequencies free of any multiples thereof. This obtains, in fact, even though the original frequencies are substantially identical. In view of this, by selecting the proper band-pass filtering means 96, the desired sum or difference frequency may be isolated and passed on to the frequency meter 98. Frequency meter 98 may be any desired frequency indicating device, as for instance, a meter affording an analogue indication or a frequency counting device affording a digital readout as by counting the number of cycles which occur during a given period of time.

Due to the fact that the several full-wave rectifiers are balanced with respect to each other, and due to the fact that the several legs of each full-wave rectifier circuit are balanced with respect to each other, certain extraneous frequencies which heretofore under certain conditions could not be separated from the desired sum or difference frequency by conventional filter means are effectively eliminated. It is thus seen that the disclosed system affords a highly accurate and sensitive apparatus for measuring force or displacement even though the force responsive device is composed of several substantially identical components for the purpose of providing extreme sensitivity. It is also seen that the disclosed frequency mixer circuit is susceptible of many applications and is particularly useful, if not necessary, in those applications wherein the several input frequencies are virtually identical.

Although I have shown and described certain specific embodiments of my invention, I am fully aware that many modifications thereof are possible. My invention, therefore, is not to be restricted except insofar as is necessitated by the prior art and by the spirit of the appended claims.

What I claim is:

1. In a force measuring system, the combination of a force responsive element, a pair of substantially identically prestressed vibratory strings having connection with said element such that movement of said element in response to variation in force thereon causes opposite variations in the stress of said strings, means for vibrating said strings at frequencies corresponding to the respective tensions thereof and for providing sinusoidally varying potentials the frequencies of which correspond to the respective frequencies of vibration; means for determining the difference in the frequencies of said potentials comprising, means responsive respectively to the frequency of vibration of said pair of strings affording the sum and the difference of said potentials, means responsive to said sum and difference affording means for squaring each of said potential sum and potential difference, means responsive to said squaring means for providing an output which is the difference between said squared potential sum and said squared potential difference, and filter means responsive to said output providing means for isolating the difference of the frequencies of said potentials from the remainder of said output.

2. In a force measuring system, the combination according to claim 1 wherein the means for squaring each of said potential sum and potential difference comprises a pair of full-wave rectifiers which are balanced with respect to each other.

3. In a force measuring system, the combination according to claim 2 wherein each of said full-wave rectifiers comprises a pair of unidirectional square-law devices which are balanced with respect to each other.

4. In a force measuring system, the combination according to claim 1 wherein the vibratory strings are electrically conductive and nonmagnetic, and wherein the means for vibrating each of said strings comprises means affording magnetic flux flow transversely of said strings and individual resistance bridge networks each of which includes a separate one of said strings as one leg thereof.

5. In a force measuring system, the combination according to claim 4 wherein the means for vibrating each of said strings further comprises individual feedback amplifiers associated with said resistance bridge networks the latter of which are balanced off the resonant frequencies of said strings whereby each of said strings constitutes a tuned electrical element, the vibration of each of said strings thereby being sustained at a frequency corresponding to the tension thereof.

6. In a force measuring system, the combination of a force responsive element, a pair of substantially identically prestressed vibratory strings having connection with said element such that movement of said element in response to variation in force thereon causes opposite variations in the stress of said strings, means for vibrating said strings at frequencies corresponding to the respective tensions thereof and for providing sinusoidally varying voltage potentials the frequencies of which correspond to the respective frequencies of vibration, means for determining the sum of the frequencies of said voltage potentials comprising, means responsive respectively to the frequency of vibration of said pair of strings affording the sum and the difference of said potentials, means responsive to said sum and difference affording means for squaring each of said potential sum and potential difference, means responsive to said squaring means for providing an output which is the difference between said squared potential sum and said squared potential difference, and filter means responsive to said output means for isolating the sum of the frequencies of said potentials from the remainder of said output free of harmonics and intermodulation products of the frequencies of said potentials.

7. A frequency mixer enabling isolation of the sum and the difference of several approximately equal frequencies having sinusoidally varying potentials comprising, means affording the sum and the difference of said voltage potentials, means responsive to said sum and difference affording means for squaring each of said potential sum and potential differences, and means electrically connected to said squaring means providing an output which is the difference between said squared potential sum and said squared potential difference, whereby the output contains both the sum and the difference of said frequencies substantially free of harmonics and intermodulation products of the original frequencies to permit of isolation of said sum and difference frequencies by conventional filter means.

8. A frequency mixer according to claim 7 wherein the means for squaring each of said potential sum and potential difference comprises a pair of full-wave rectifiers which are balanced with respect to each other.

9. A frequency mixer according to claim 8 wherein each of said full-wave rectifiers comprises a pair of unidirectional square-law devices which are balanced with respect to each other.

10. A frequency mixer according to claim 8 wherein the means for squaring each of said potential sum and potential difference comprises individual transformers each of which has a primary winding and a center-tapped secondary winding connected in circuit with the respective one of said full-wave rectifiers.

11. A frequency mixer according to claim 9 wherein the unidirectional square-law devices are germanium diodes.

References Cited in the file of this patent

UNITED STATES PATENTS 2,513,678 Rieber ---------------- July 4, 1950